(12) United States Patent
Huang et al.

(10) Patent No.: US 8,557,673 B1
(45) Date of Patent: Oct. 15, 2013

(54) MANUFACTURING METHOD FOR HIGH CAPACITANCE CAPACITOR STRUCTURE

(75) Inventors: Shin-Bin Huang, Hsinchu County (TW); Cheng-Yeh Hsu, Taoyuan County (TW); Chung-Lin Huang, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 3 days.

(21) Appl. No.: 13/476,251

(22) Filed: May 21, 2012

(30) Foreign Application Priority Data

Mar. 21, 2012 (TW) ............................... 101109649 A

(51) Int. Cl.
*H01L 21/02* (2006.01)
(52) U.S. Cl.
USPC ................................... 438/386; 257/E21.008
(58) Field of Classification Search
USPC ................................... 438/386; 257/E21.008
See application file for complete search history.

(56) References Cited

U.S. PATENT DOCUMENTS

2011/0092044 A1* 4/2011 Huang et al. .................. 438/387

* cited by examiner

*Primary Examiner* — William D Coleman
*Assistant Examiner* — Christine Enad
(74) *Attorney, Agent, or Firm* — Rosenberg, Klein & Lee

(57) ABSTRACT

A manufacturing method of a capacitor structure is provided, which includes the steps of: on a substrate having a first oxide layer, (a) forming a first suspension layer on the first oxide layer; (b) forming a first shallow trench into the first oxide layer above the substrate; (c) forming a second oxide layer filling the first shallow trench; (d) forming a second suspension layer on the second oxide layer; (e) forming a second shallow trench through the second suspension layer into the second oxide layer above the first suspension layer; (f) forming at least one deep trench on the bottom surface of the second shallow trench through the second and the first oxide layers, (g) forming an electrode layer on the inner surface of the deep trench; and (h) removing the first and second oxide layers through the trench openings in the first and the second suspension layers.

10 Claims, 5 Drawing Sheets

MANUFACTURING METHOD FOR HIGH CAPACITANCE CAPACITOR STRUCTURE

BACKGROUND OF THE INVENTION

1. Field of the Invention

The instant disclosure relates to a manufacturing method of capacitor structure; in particular, to a manufacturing method of high capacitance capacitor structure of dynamic random access memory (DRAM).

2. Description of Related Art

Random access memory (RAM) is a form of computer data storage which includes transistors, capacitors and peripheral controlling unit. In order to increase computing performance, it is important to increase the surface area of the capacitor unit in the memory to increase the electric charge storing capacity.

The technology of integrating double sided capacitor in dynamic random access memory (DRAM) has been of increased emphasis. In order to further advance the integration of DRAM, a miniaturization process that can effectively reduce the section area per unit of capacitance and the space between two electrodes of capacitor is greatly desired. In the limited space that a modern miniaturized electric component can spare, a capacitor needs to achieve small form factor yet at the same time capable of providing adequate capacitance to remain satisfied signal intensity. Accordingly, DRAM design needs to focus on the capacitor structure and the layout closely affecting the capacitance thereof. The use of double sided capacitor, which offers higher per unit charge storing capacity, ma be helpful in the reduction of an overall height of a memory unit.

However, conventional double sided capacitor structure has a large aspect ratio of height over width for obtaining a large surface area, which makes the capacitor structurally weaker and unstable, which leads to the increased risk of collapse. In addition, the manufacturing method of the above-mentioned capacitor generally requires a complex process flow, wherein the photolithography process requires a high-precision in alignment. As a result, the conventional manufacturing process flow may be inadequate in achieving desired production and yield rate.

To address the above issues, the inventors strive via industrial experience and academic research to present the instant disclosure, which can effectively improve the limitations described above.

SUMMARY OF THE INVENTION

The first object of the instant disclosure is to manufacture a plurality of double-side capacitors of DRAM to promote the capacitance of the capacitors.

The second object of the instant disclosure is to improve the structure strength of the double-side capacitors.

The third object of the instant disclosure is to reduce the resetting time of the DRAM to improve the working efficiency of the DRAM.

In order to achieve the aforementioned objects, according to an embodiment of the instant disclosure, a manufacturing method of high capacitance capacitor structure is provided, which includes the steps of: on a substrate (15) having a first oxide layer (17) disposed on a top surface thereof, (a) forming a first suspension layer (11) on the first oxide layer (17); (b) forming at least one first shallow trench (13) through the first suspension layer into the first oxide layer above the substrate; (c) forming a second oxide layer (not numbered) on the first suspension layer and filling the first shallow trench; (d) forming a second suspension layer (12) on the second oxide layer; (e) forming at least one second shallow trench (14) through the second suspension layer into the second oxide layer above the first suspension layer (11); (f) forming at least one deep trench (16) on the bottom surface of the second shallow trench (14) through the second and the first oxide layers (17), where the cross-section of the deep trench (16) is smaller than that of the shallow trench (14); (g) forming an electrode layer (18) on the inner surface of the deep trench; and (h) removing the first and second oxide layers (17) through the trench openings in the first and the second suspension layers (11/12).

According to the manufacturing method of high capacitance capacitor structure, wherein the inside diameter of the second shallow trench is longer than the inside diameter of the first shallow trench.

According to the manufacturing method of high capacitance capacitor structure, wherein the inside diameter of the first shallow trench is longer than the inside diameter of the deep trench, the inside diameter of the second shallow trench is longer than the inside diameter of the deep trench.

Base on above, the capacitors manufactured by aforementioned manufacturing method may achieve better capacitance and structure strength.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
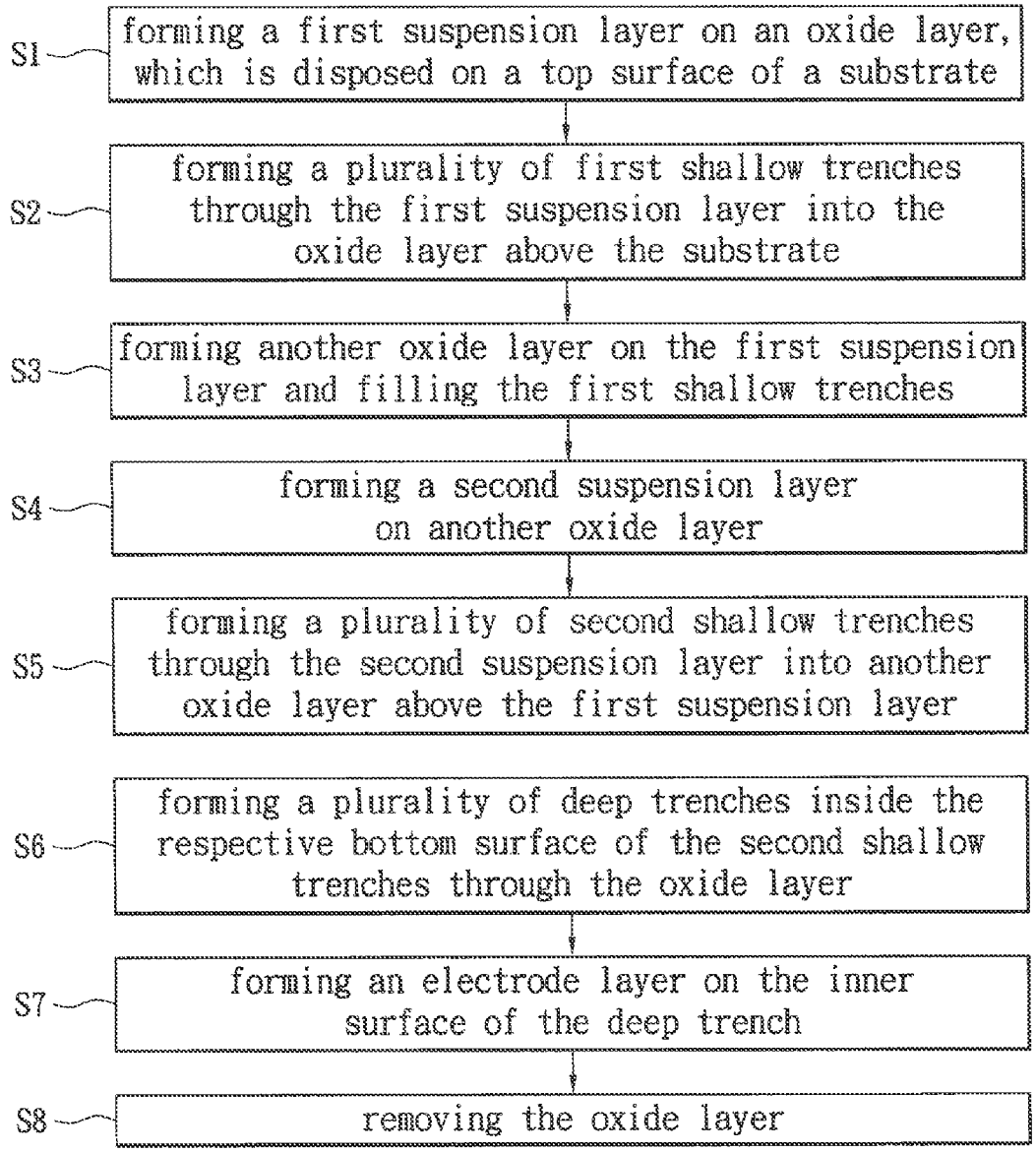
FIG. 1 shows a flow chart of the manufacturing method for high capacitance capacitor in accordance with an embodiment of the instant disclosure.

FIG. 1 illustrates an exemplary flow chart of the manufacturing method of high capacitance capacitor in accordance with the instant disclosure. Each step recited in the flow chart of FIG. 1 corresponds to a lateral cross-sectional illustration provided in a following figure.

Figure 2:
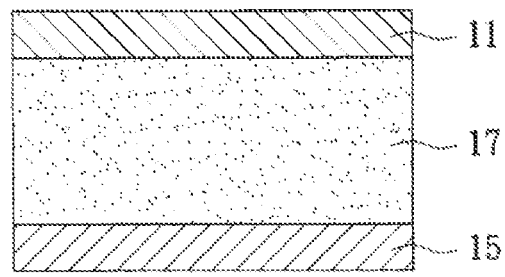
FIG. 2 shows a lateral cross-sectional view of the formation of a first suspension layer according to the manufacturing method for high capacitance capacitor.

First, with reference to FIG. 2, step S1 is forming a first suspension layer 11 on an oxide layer 17, which is disposed on a top surface of a substrate 15. In this embodiment, the oxide layer 17 is preferably made of tetraeth oxysilane (TEOS), phosphor-silicate glass (PSG), or un-dopant silicon glass (USG). The substrate 15 is preferably made of silicon nitride (SiN). The first suspension layer 11 is preferably made of silicon nitride and formed on the oxide layer 17 in one performance of the process of deposition. Particularly, the first suspension layer 11 is preferably formed by a physical vapor deposition (PVD) process or a chemical vapor deposition (CVD) process, which provide higher degree of control over the thickness of the first suspension layer 11.

Figure 3:
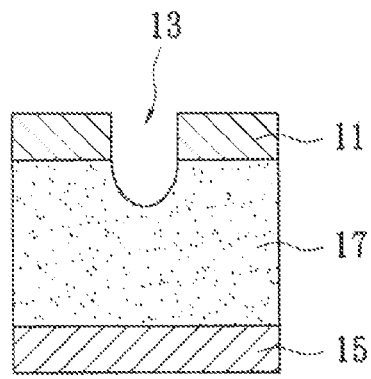
FIG. 3 shows a lateral cross-sectional view of the formation of a first shallow trench according to the manufacturing method for high capacitance capacitor.

Please refer to FIG. 3, the step S2 is forming a plurality of first shallow trenches 13 through the first suspension layer 11 into the oxide layer 17 above the substrate 15. In particular, step S2 includes the formation a patterned photoresist layer on the first suspension layer 11, then etching the exposed first suspension layer 11 into the oxide layer 17 above the substrate 15 to form a plurality of first shallow trenches 13.

Figure 4:
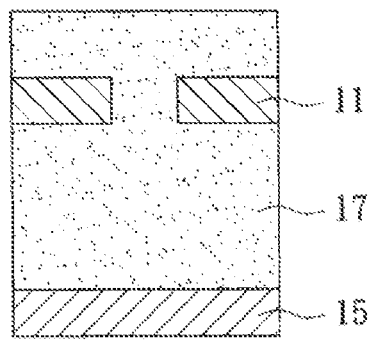
FIG. 4 shows a lateral cross-sectional view of the formation of a second oxide layer according to the manufacturing method for high capacitance capacitor.
Figure 5:
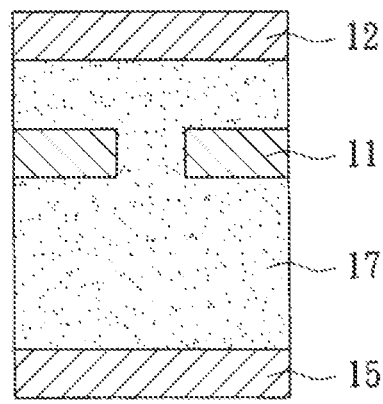
FIG. 5 shows a lateral cross-sectional view of the formation of a second suspension layer according to the manufacturing method for high capacitance capacitor.

Please refer to FIG. 4, the step S3 is forming another oxide layer 17 making of TEOS, PSG, or USG on the first suspension layer 11 and filling the first shallow trenches 13. Subsequently refer to FIG. 5, the step S4 is forming a second suspension layer 12 on another oxide layer 17, and the second suspension layer 12 is also made of silicon nitride.

Figure 6:
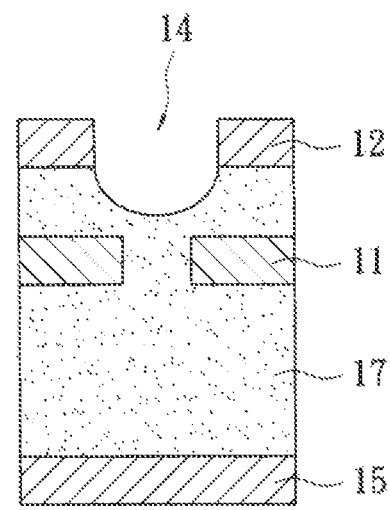
FIG. 6 shows a lateral cross-sectional view of the formation of a second shallow trench according to the manufacturing method for high capacitance capacitor.

Please refer to FIG. 6. Step S5 is forming a plurality of second shallow trenches 14 through the second suspension layer 12 into another oxide layer 17 above the first suspension layer 11. In this embodiment, the inside diameter of the second shallow trench 14 is larger than the inside diameter of the first shallow trench 13, and the second shallow trench 14 is formed respectively in the first shallow trench 13. In other embodiment, the first shallow trench 13 may or may not align to the second shallow trench 14. Specifically, the second shallow trenches 14 may be formed by aforementioned etching process. Generally speaking, the first shallow trenches 13 and second shallow trenches 14 are formed by using low selective etching solution. For reference, the aforementioned selective ratio is defined as the ratio of etching rate between two different materials.

Figure 7A:
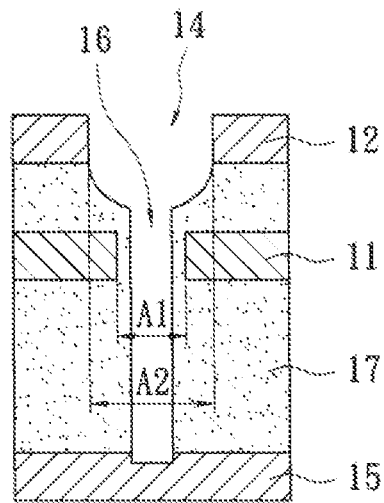
FIG. 7A shows a lateral cross-sectional view of the formation of a deep trench according to the manufacturing method for high capacitance capacitor.
Figure 7B:
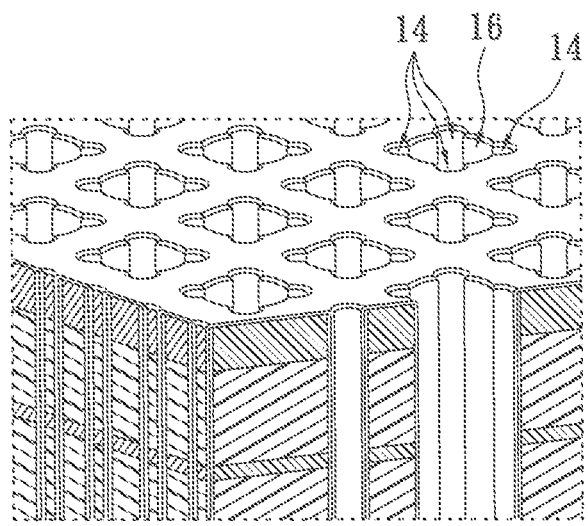
FIG. 7B shows a perspective view, viewing form the top at an angle, of the formation of a plurality of deep trenches according to the manufacturing method for high capacitance capacitor.

Please refer to FIG. 7A. Step S6 is forming a plurality, of deep trenches 16 inside the respective bottom surface of the second shallow trenches 14 through the oxide layer 17. In this embodiment, the inside diameter of the first shallow trench 13 is longer than the inside diameter of the deep trench 16, and the inside diameter of the second shallow trench 14 is longer than the inside diameter of the deep trench 16. The deep trench may or may not align to the first shallow trench 13 and the second shallow trench 14. Subsequently refer to FIG. 7B, step S6 comprises the steps of forming a patterned photoresist layer to cover the second suspension layer 12 and a selected portion of the second shallow trenches 14, then removing the uncovered oxide layer 17 to form a plurality of deep trenches 16. Specially speaking, four deep trenches 16 are formed inside the bottom surface of the second shallow trenches 14, and each of the deep trenches 16 is substantially cylindrical in shape.

Figure 8:
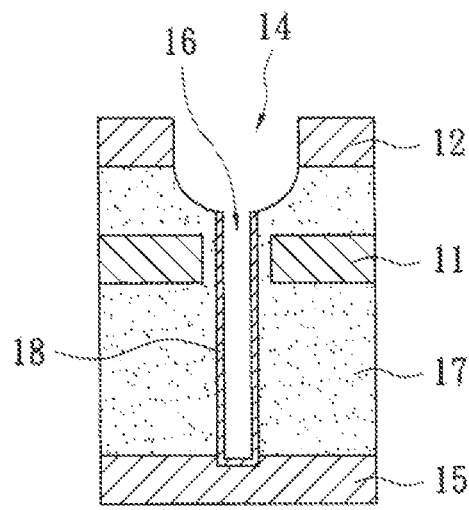
FIG. 8 shows a lateral cross-sectional view of the formation of a electrode layer according to the manufacturing method for high capacitance capacitor.

Please refer to FIG. 8, forming an electrode layer 18 on the inner surface of the deep trench 16. The electrode layer 18 is preferably made of titanium or titanium nitride. In this embodiment, the electrode layer 18 formed on the bottom portion of the inner surface of the deep trench 16 is made of titanium, and the electrode layer 18 formed on the side portion of the inner surface of the deep trench 16 is made of titanium nitride.

Figure 9:
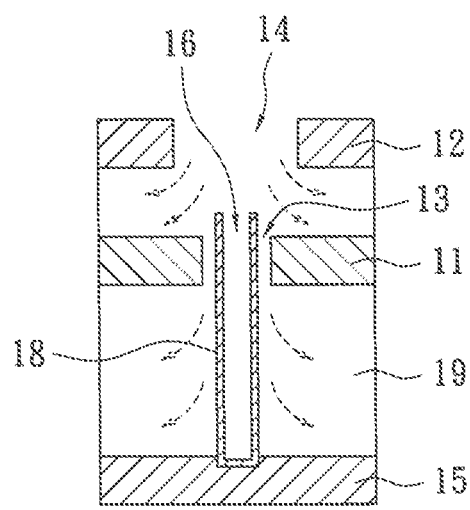
FIG. 9 shows a lateral cross-sectional view of the formation of a capacitor according to the manufacturing method for high capacitance capacitor.

Finally, with reference to FIG. 9, Step S8 is removing the oxide layer 17, preferably by a dip-out process through the second shallow trench 14 (as well as through the aperture in the first suspension layer 11 resulting from the formation of the first shallow trench 13). General speaking, the step S8 comprises the steps of forming a patterned photoresist layer to cover a selected portion of the electrode layer 18 and a selected portion of the deep trench 16 to expose the oxide layer 17, then removing the oxide layer 17 by a wet etching step using etching solution to form a plurality of double-side capacitors structure. Preferably, the etching solution is hydrofluoric acid so the capacitors are substantially perpendicular to the substrate 15, and the double-side capacitors can improve the electric charge stored thereon. Specially, the electrode layer 18 is supported by the first suspension layer 11 and the second suspension layer 12 so that the double-side capacitors have improved structure strength.

Base on above, the manufacturing method of the present invention has the following advantages:

1. The manufacturing method of the present invention firstly forms a plurality of first shallow trenches, and subsequently forms a plurality of second shallow trenches to expose the oxide layer. In addition, the oxide layer can be removed by a wet step using hydrofluoric acid to form a plurality of double-side capacitors. Thereby, the capacitors are substantially perpendicular to the substrate 15, and the double-side capacitors can improve the electric charge stored thereon to reduce the resetting time.

2. The electrode layer 18 formed by the manufacturing method of the present invention is supported by the first suspension layer 11 and the second suspension layer 12 so that the double-side capacitors have improved structure strength.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A manufacturing method of high capacitance capacitor structure, comprising the steps of:
  providing a substrate (15) having a first oxide layer (17) formed on a top surface thereof;
  forming a first suspension layer (11) on the first oxide layer;
  forming a first shallow trench (13) through the first suspension layer into the first oxide layer above the substrate;
  forming a second oxide layer on the first suspension layer (11) and filling the first shallow trench;
  forming a second suspension layer (12) on the second oxide layer;
  forming a second shallow trench (14) through the second suspension layer (12) into the second oxide layer above the first suspension layer (11);
  forming at least one deep trench (16) on the bottom surface of the second shallow trench (14) through the first oxide layer (17) and the second oxide layer, the cross-section of the deep trench (16) being smaller than that of the second shallow trench (14);

forming a electrode layer (18) on the inner surface of the deep trench; and removing the first oxide layer and the second oxide layer through the trench openings in the first and the second suspension layers.

2. The manufacturing method of high capacitance capacitor structure according to claim 1, wherein the first suspension layer is made of silicon nitride, the second suspension layer is made of silicon nitride.

3. The manufacturing method of high capacitance capacitor structure according to claim 1, wherein the step of providing a substrate having a first oxide layer thereon comprising the steps of:

providing a substrate; and depositing a the first oxide layer on the substrate.

4. The manufacturing method of high capacitance capacitor structure according to claim 1, wherein the inside diameter of the second shallow trench is longer than the inside diameter of the first shallow trench.

5. The manufacturing method of high capacitance capacitor structure according to claim 1, wherein the electrode layer is made of titanium or titanium nitride.

6. The manufacturing method of high capacitance capacitor structure according to claim 1, wherein the electrode layer formed on the bottom portion of the inner surface of the deep trench is made of titanium.

7. The manufacturing method of high capacitance capacitor structure according to claim 1, wherein the electrode layer formed on the side portion of the inner surface of the deep trench is made of titanium nitride.

8. The manufacturing method of high capacitance capacitor structure according to claim 1, wherein the first shallow is formed by an etching step, the second shallow is formed by an etching step.

9. The manufacturing method of high capacitance capacitor structure according to claim 1, wherein the inside diameter of the first shallow trench is longer than the inside diameter of the deep trench, the inside diameter of the second shallow trench is longer than the inside diameter of the deep trench.

10. The manufacturing method of high capacitance capacitor structure according to claim 1, wherein the first oxide layer is made of TEOS, PSG, or USG, the second oxide layer is made of TEOS, PSG, or USG.

* * * * *